(12) United States Patent  
Minami

(10) Patent No.: US 7,154,151 B2  
(45) Date of Patent: Dec. 26, 2006

(54) SEMICONDUCTOR DEVICE

(75) Inventor: Yoshihiro Minami, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/015,036

(22) Filed: Dec. 20, 2004

(65) Prior Publication Data

US 2005/0269642 A1 Dec. 8, 2005

(30) Foreign Application Priority Data

Jun. 3, 2004 (JP) ............................. 2004-165789

(51) Int. Cl.  
*H01L 23/62* (2006.01)

(52) U.S. Cl. .................. 257/355; 257/356; 257/357; 257/360

(58) Field of Classification Search ........ 257/355–357, 257/360  
See application file for complete search history.

(56) References Cited

U.S. PATENT DOCUMENTS

| | | |
|---|---|---|
| 5,825,067 A | 10/1998 | Takeuchi et al. |
| 6,074,899 A | 6/2000 | Voldman |
| 6,452,234 B1 | 9/2002 | Mahanpour |
| 6,611,024 B1 * | 8/2003 | Ang et al. .................. 257/350 |

FOREIGN PATENT DOCUMENTS

| | | |
|---|---|---|
| JP | 09-223802 | 8/1997 |
| JP | 2001-028424 | 1/2001 |
| JP | 2001-308330 | 11/2001 |
| JP | 2002-110990 | 4/2002 |
| JP | 2002-538598 | 11/2002 |
| JP | 2003-031693 | 1/2003 |
| WO | WO 00/44049 | 7/2000 |

\* cited by examiner

*Primary Examiner*—Thien F. Tran  
(74) *Attorney, Agent, or Firm*—Oblon, Spivak, McClelland, Maier & Neustadt, P.C.

(57) ABSTRACT

A semiconductor device comprises a semiconductor substrate; an embedded insulating layer provided on the semiconductor substrate; a semiconductor layer provided on the embedded insulating layer; a transistor including a first conductivity type source layer formed within the semiconductor layer, a first conductivity type drain layer formed in the semiconductor layer, and a channel forming region between the source layer and the drain layer; and an embedded insulating layer protective diode including a second conductivity type first diffusion layer and a first conductivity type second diffusion layer, the first diffusion layer being at the same potential as a semiconductor substrate region immediately below the channel forming region, the second diffusion layer being provided adjacently to the first diffusion layer and electrically connected to at least one of the source layer, the drain layer and the channel forming region.

16 Claims, 14 Drawing Sheets

800

SEMICONDUCTOR DEVICE

CROSS-REFERENCE TO RELATED APPLICATIONS

This application is based upon and claims the benefit of priority from the prior Japanese Patent Applications No. 2004-165789, filed on Jun. 3, 2004, the entire contents of which are incorporated herein by reference.

BACKGROUND OF THE INVENTION

1. Field of the Invention

The present invention relates to a semiconductor device.

2. Background Art

Recently, with miniaturization and complication of a semiconductor device, a multilayer interconnection structure is adopted. In order to form the multilayer interconnection structure, it is necessary to repeatedly perform plasma CVD (Chemical Vapor Deposition), RIE (Reactive Ion Etching) or the like on a MOS transistor. Since these treatments are for performing deposition or etching utilizing electrical polarities, a gate electrode and a substrate are charged. Thereby, there is a possibility that an excessive electric field is applied to a gate insulating film and the gate insulating film is destroyed. Further, after the semiconductor device is completed, there is a possibility that the gate insulating film is broken down by human electrostatic discharge (ESD), for example.

A protective diode is formed for protecting a MOS transistor from such plasma damage or electrostatic damage. The protective diode is connected between the gate electrode and the substrate so as to be reversely biased when a gate voltage is applied thereto. Thereby, the protective diode prevents the gate electrode from being applied with a voltage more than the reverse break-down voltage.

By the way, recently, a technology for forming a MOS transistor or memory device on SOI (Silicon On Insulator) is developed. Since the embedded oxide film (also referred to as "BOX" (Buried Oxide) layer) is getting very thinner (for example, 10 nm to 300 nm), not only the protection of the gate oxide film, but also the BOX layer can be broken down by the plasma damage or the electrostatic damage (see Publication of Japanese Patent Application No. 2002-538598 and International Publication No. W00/44049 pamphlet).

Accordingly, a semiconductor device in which, in the case where a MOS transistor or memory device is formed on an SOI substrate, not only the gate oxide film, but also the BOX layer can be protected from plasma damage or electrostatic damage is desired.

SUMMARY OF THE INVENTION

A semiconductor storage device according to an embodiment of the present invention comprises a semiconductor substrate; an embedded insulating layer provided on the semiconductor substrate; a semiconductor layer provided on the embedded insulating layer; a transistor including a first conductivity type source layer formed within the semiconductor layer, a first conductivity type drain layer formed in the semiconductor layer, and a channel forming region between the source layer and the drain layer; and an embedded insulating layer protective diode including a second conductivity type first diffusion layer and a first conductivity type second diffusion layer, the first diffusion layer being at the same potential as a semiconductor substrate region immediately below the channel forming region, the second diffusion layer being provided adjacently to the first diffusion layer and electrically connected to at least one of the source layer, the drain layer and the channel forming region;

Wherein the semiconductor substrate is a second conductivity type, and the semiconductor substrate region immediately below toe channel forming region is a first conductivity type.

DETAILED DESCRIPTION OF THE INVENTION

Figure 1:
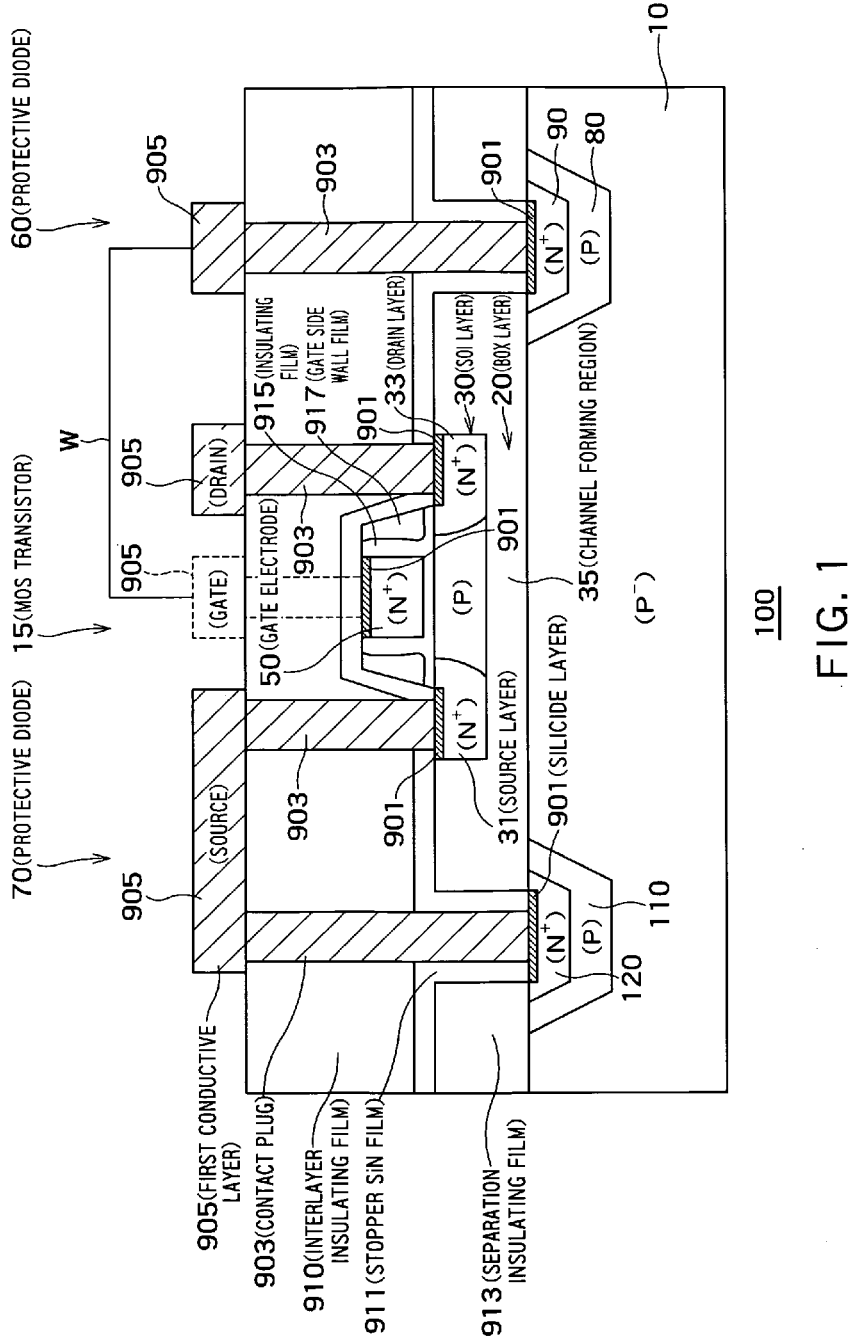
FIG. 1 is a sectional view of a semiconductor device 100 according to a first reference example according to the invention.

Hereinafter, embodiments according to the invention will be described by referring to the drawings. These embodiments do not limit the invention. In these embodiments, for convenience, only one MOS transistor is shown, but two or more MOS transistors may be formed. Further, when a component of an N-type semiconductor is adopted in place of a component of a P-type semiconductor and a component of a P-type semiconductor is adopted in place of a component of an N-type semiconductor, advantages of these embodiments are never lost.

FIRST REFERENCE EXAMPLE

FIG. 1 is a sectional view of a semiconductor device 100 according to a first reference example according to the invention. The semiconductor device 100 is formed on an SOI substrate having a P⁻-type semiconductor substrate 10 consisting of silicon, an embedded insulating layer (hereinafter, referred to as "BOX layer") 20 provided on the semiconductor substrate 10, and a semiconductor layer (hereinafter, referred to as "SOI layer") 30 provided on the BOX layer 20.

The semiconductor device 100 includes an N-type channel MOS transistor 15 formed on the SOI substrate. The MOS transistor 15 has an N$^+$-type source layer 31 and an N$^+$-type drain layer 33 within the SOI layer 30. A channel forming region 35 is provided between the source layer 31 and the drain layer 33. On the channel forming region 35, a gate electrode 50 is formed via a gate insulating film 40.

The source layer 31 is electrically connected to an embedded insulating layer protective diode 70 (hereinafter, simply referred to as "protective diode 70") formed on the semiconductor substrate 10. The protective diode 70 has a P-type first diffusion layer 110 and an N$^+$-type second diffusion layer 120. The first diffusion layer 110 is formed in the surface region of the semiconductor substrate 10, and the second diffusion layer 120 is formed within the first diffusion layer 110 so as to be adjacent to the first diffusion layer 110. The first diffusion layer 110 is at the same potential as the semiconductor substrate 10 immediately below the channel forming region 35, and the second diffusion layer 120 is at the same potential as the source layer 31.

On the source layer 31, the drain layer 33, the second diffusion layer 120, and a fourth diffusion layer 90, silicide layers 901 are provided. Contact plugs 903 are provided on the silicide layers 901. The mutually adjacent contact plugs 903 are insulated by a isolation insulating film 913, a stopper SiN film 911, and an interlayer insulating film 910. First conductive layers 905 are provided on the interlayer insulating film 910. The source layer 31 and the second diffusion layer 120 are electrically connected each other by the first conductive layers 905 via the silicide layers 901 and the contact plugs 903. The gate electrode 50 and the fourth diffusion layer 90 are electrically connected each other by the first conductive layers 905 and wiring W via the silicide layers 901 and the contact plugs 903. The wiring W may be provided in the same layer as the first conductive layers 905. Furthermore, the gate electrode 50 is covered by an insulating film 915 and a gate side wall film 917. A wiring layer is further formed according to need on the first conductive layers 905.

The protective diode 70 has a lower reverse break-down voltage than the break-down voltage of the BOX layer 20. Recently, the BOX layer 20 is getting thinner gradually, and expected to be made thinner to the thickness of 10 nm to 20 nm nearly equal to that of the gate insulating film 40. For example, when the thickness of the BOX layer 20 is about 10 nm to 20 nm, the break-down voltage of the BOX layer 20 is about ten and several volts. Therefore, in this case, the reverse break-down voltage of the protective diode 70 must be less than ten and several volts and more preferably, on the order of several volts.

When an excessive positive voltage is applied to the SOI layer 30 by plasma, static electricity, etc. during manufacturing or after manufacturing of the semiconductor device 100, the protective diode 70 is broken down prior to the BOX layer 20. Thereby, because the protective diode 70 discharges charge to the semiconductor substrate 10, the BOX layer 20 is not broken down. Thus, the protective diode 70 can protect the BOX layer 20 immediately below the source layer 31, the drain layer 33 and the cannel forming region 35. Note that, when a negative voltage is applied to the SOI layer 30, the protective diode 70 is forwardly biased, and thereby, naturally, the BOX layer 20 is not broken down.

On the other hand, the gate electrode 50 is electrically connected to a gate insulating film protective diode 60 (hereinafter, simply referred to as "protective diode 60") formed on the semiconductor substrate 10. The protective diode 60 has a P-type third diffusion layer 80 formed in the surface region of the semiconductor substrate 10 and an N$^+$-type fourth diffusion layer 90 formed within the third diffusion layer 80 so as to be adjacent to the third diffusion layer 80. The third diffusion layer 80 is at the same potential as the semiconductor substrate 10 immediately below the channel forming region 35, and the fourth diffusion layer 90 is at the same potential as the gate electrode 50. Note that, since the SOI layer 30 is substantially at the same potential as the semiconductor substrate 10 by the protective diode 70, even if the third diffusion layer 80 is at the same potential as the semiconductor substrate 10, the gate insulating film 40 can be protected.

The protective diode 60 has a lower reverse break-down voltage than the break-down voltage of the gate insulating film 40. For example, when the thickness of the gate insulating film 40 is about 10 nm to 20 nm, the break-down voltage of the gate insulating film 40 is about ten and several volts. Therefore, in this case, the reverse break-down voltage of the protective diode 60 must be less than ten and several volts, and more preferably, on the order of several volts.

Since the MOS transistor 15 is an N-channel type FET, it is switched by applying a positive voltage to the gate electrode 50. At this time, a reverse bias is applied to the protective diode 60. When an excessive voltage is applied to the gate electrode 50 during operation of the MOS transistor 15, the protective diode 60 is broken down prior to the gate insulating film 40. Thereby, because the protective diode 60 discharges charge to the semiconductor substrate 10, the gate insulating film 40 will not be broken down. Thus, the protective diode 60 can protect the gate insulating film 40.

When an excessive voltage is applied to the gate electrode 50 by plasma, static electricity, etc. during manufacture or after manufacture of the semiconductor device 100, the protective diode 60 can also protect the gate insulating film 40. When a negative voltage is applied to the gate electrode 50, since the protective diode 60 is forwardly biased, thereby, naturally, the gate insulating film 40 is not broken down.

As described above, the first reference example can protect not only the gate insulating film 40, but also the BOX layer 20 from plasma damage or electrostatic damage. Further, in the first reference example, since the protective diodes 60 and 70 are formed on the semiconductor substrate 10, relatively large current can be allowed to flow. Therefore, the first reference example can reliably protect the gate insulating film 40 and the BOX layer 20.

SECOND REFERENCE EXAMPLE

Figure 2:
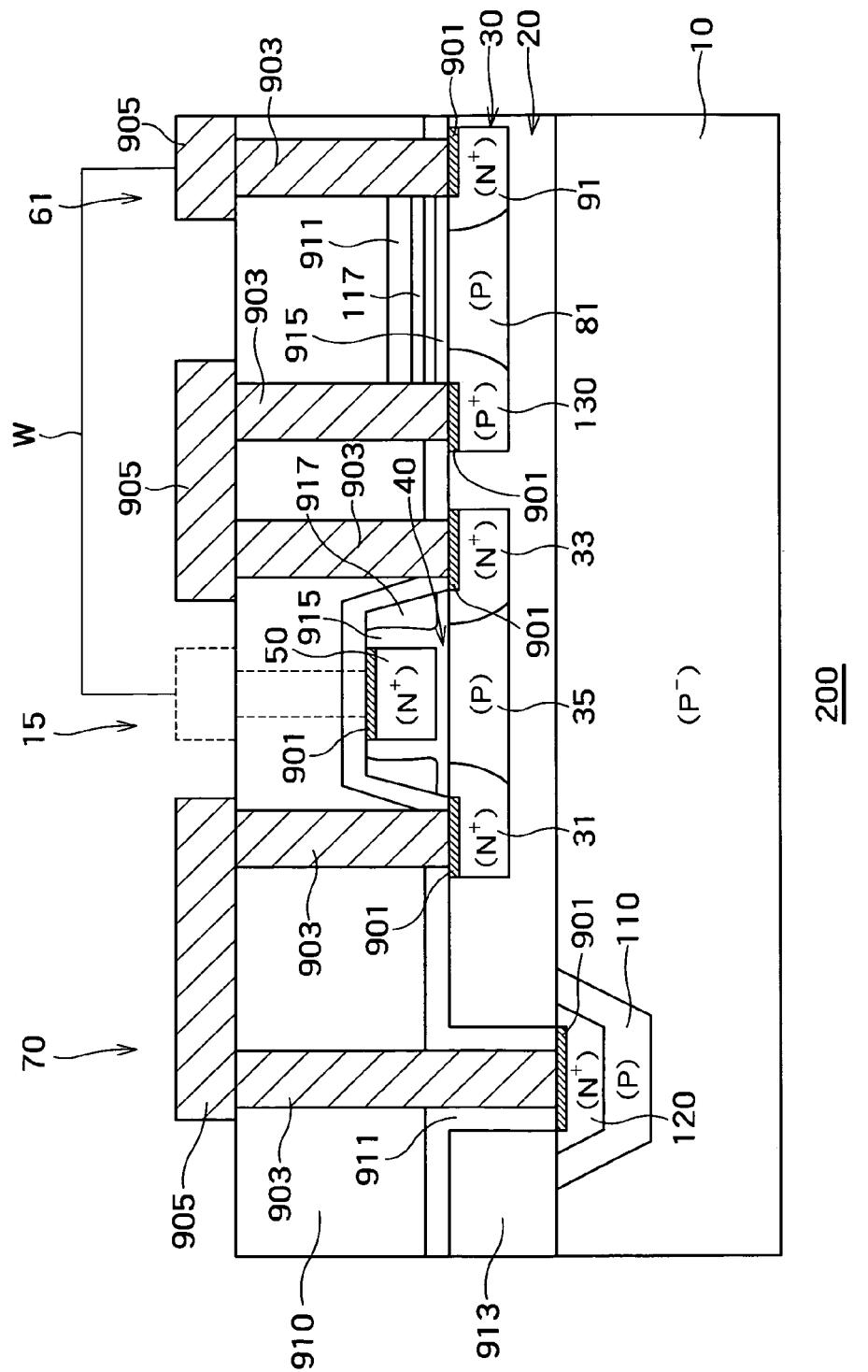
FIG. 2 is a sectional view of a semiconductor device 200 according to a second reference example according to the invention.

FIG. 2 is a sectional view of a semiconductor device 200 according to a second reference example according to the invention. The second reference example is different from the first reference example on the point that a gate insulating film protective diode 61 is formed in the SOI layer 30.

The protective diode 61 has a P-type third diffusion layer 81 and an N$^+$-type fourth diffusion layer 91. The third diffusion layer 81 is formed within the SOI layer 30, and the fourth diffusion layer 91 is formed within the SOI layer 30 so as to be adjacent to the third diffusion layer 81. Furthermore, the protective diode 61 has a P$^+$-type contact layer 130 so as to electrically connect the third diffusion layer 81 and the drain layer 33.

Silicide layers 901 are provided on the contact layer 130. Contact plugs 903 are provided on the silicide layers 901. The contact layer 130 and the drain layer 33 are electrically connected each other by the first conductive layers 905 via the silicide layers 901 and the contact plugs 903. Further, since the third diffusion layer 81 is electrically connected to the drain layer 33, the third diffusion layer 81 is at the same potential as the drain layer 33. Since the fourth diffusion layer 91 is electrically connected to the gate electrode 50, the fourth diffusion layer 91 is at the same potential as the gate electrode 50.

The protective diode 61 has a lower reverse break-down voltage than the break-down voltage of the gate insulating film 40. For example, when the thickness of the gate insulating film 40 is about 10 nm to 20 nm, the reverse break-down voltage of the protective diode 61 must be less than ten and several volts, and more preferably, on the order of several volts.

When a positive voltage is applied to the gate electrode 50, a reverse bias is applied to the protective diode 61. When an excessive voltage is applied to the gate electrode 50 during operation of the semiconductor device 200, the protective diode 61 is broken down prior to the gate insulating film 40. Thereby, because the protective diode 61 discharges charge to the drain layer 33, the gate insulating film 40 will not be broken down. Thus, the protective diode 61 can protect the gate insulating film 40.

When an excessive voltage is applied to the gate electrode 50 by plasma, static electricity, etc. during manufacture or after manufacture of the semiconductor device 200, the protective diode 61 can also protect the gate insulating film 40. Thereby, the second reference example has the same advantage as the first reference example.

THIRD REFERENCE EXAMPLE

Figure 3:
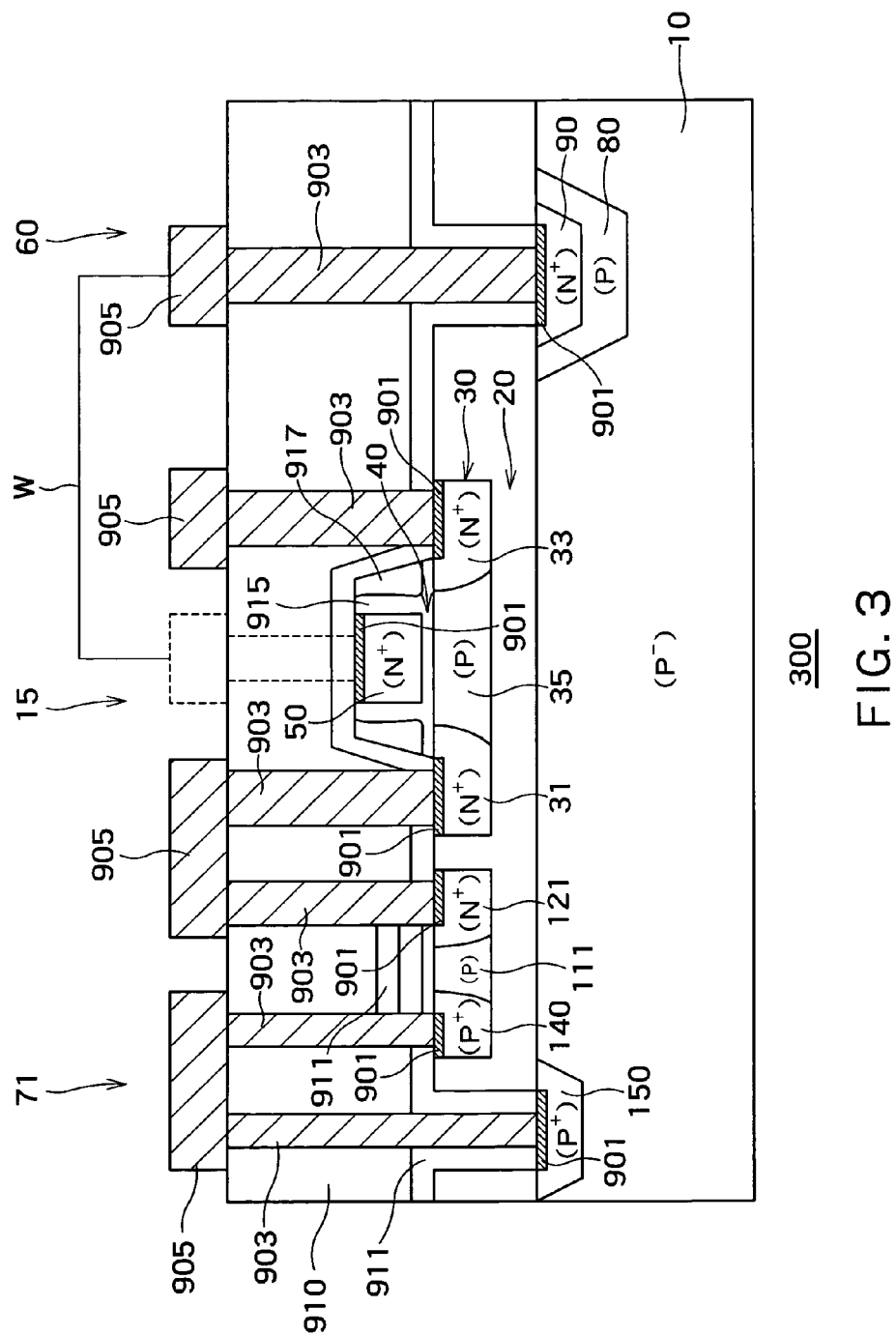
FIG. 3 is a sectional view of a semiconductor device 300 according to a third reference example according to the invention.

FIG. 3 is a sectional view of a semiconductor device 300 according to a third reference example according to the invention. The third reference example is different from the first reference example on the point that an embedded insulating layer protective diode 71 is formed in the SOI layer 30.

The protective diode 71 has a P-type first diffusion layer 111 formed within the SOI layer 30 and an N$^+$-type second diffusion layer 121 formed within the SOI layer 30 so as to be adjacent to the first diffusion layer 111. Furthermore, the protective diode 71 has a P$^+$-type contact layer 140 within the SOI layer 30 and a P$^+$-type contact layer 150 in the semiconductor substrate 10 so as to electrically connect the first diffusion layer 111 and the semiconductor substrate 10 each other.

Silicide layers 901 are provided on the second diffusion layer 121, the contact layer 140 and the contact layer 150. Contact plugs 903 are provided on the silicide layers 901. The second diffusion layer 121 and the source layer 31 are electrically connected each other by the first conductive layers 905 via the silicide layers 901 and the contact plugs 903. The contact layer 140 and the contact layer 150 are also electrically connected each other by the first conductive layers 905 via the silicide layers 901 and the contact plugs 903.

Thereby, since the first diffusion layer 111 is electrically connected to the semiconductor substrate 10, the first diffusion layer 111 is at the same potential as the region of the semiconductor substrate 10 immediately below the channel forming region 35. Since the second diffusion layer 121 is electrically connected to the source layer 31, the second diffusion layer 121 is at the same potential as the source layer 31.

The protective diode 71 has a lower reverse break-down voltage than the break-down voltage of the BOX layer 20. When the thickness of the BOX layer 20 is about 10 nm to 20 nm, the reverse break-down voltage of the protective diode 71 must be less than ten and several volts, as well as the protective diode 61, and more preferably, on the order of several volts.

When an excessive positive voltage is applied to the SOI layer 30 by plasma, static electricity, etc. during manufacture or after manufacture of the semiconductor device 300, the protective diode 71 is broken down prior to the BOX layer 20. Thereby, because the protective diode 71 discharges charge to the semiconductor substrate 10, the BOX layer 20 is not broken down. Thus, the protective diode 71 can protect the BOX layer 20. That is, the third reference example has the same advantage as the first reference example.

FOURTH REFERENCE EXAMPLE

Figure 4:
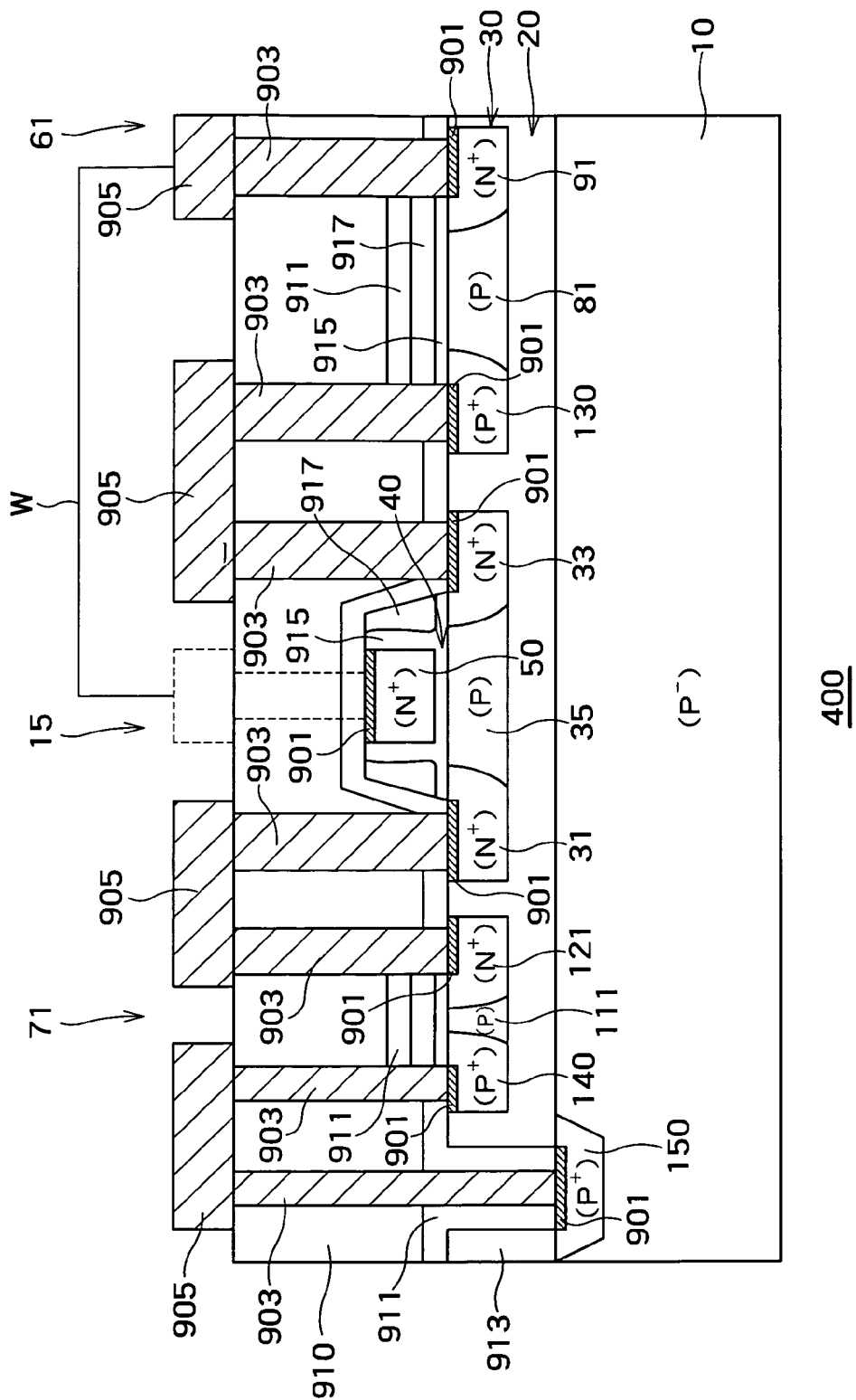
FIG. 4 is a sectional view of a semiconductor device 400 according to a fourth reference example according to the invention.

FIG. 4 is a sectional view of a semiconductor device 400 according to a fourth reference example according to the invention. The fourth reference example is an embodiment in which the protective diode 61 is adopted as a gate insulating film protective diode, and the protective diode 71 is adopted as an embedded insulating layer protective diode.

In the fourth reference example, similarly, the protective diode 61 can protect the gate insulating film 40 and the protective diode 71 can protect the BOX layer 20.

First Embodiment

Figure 5:
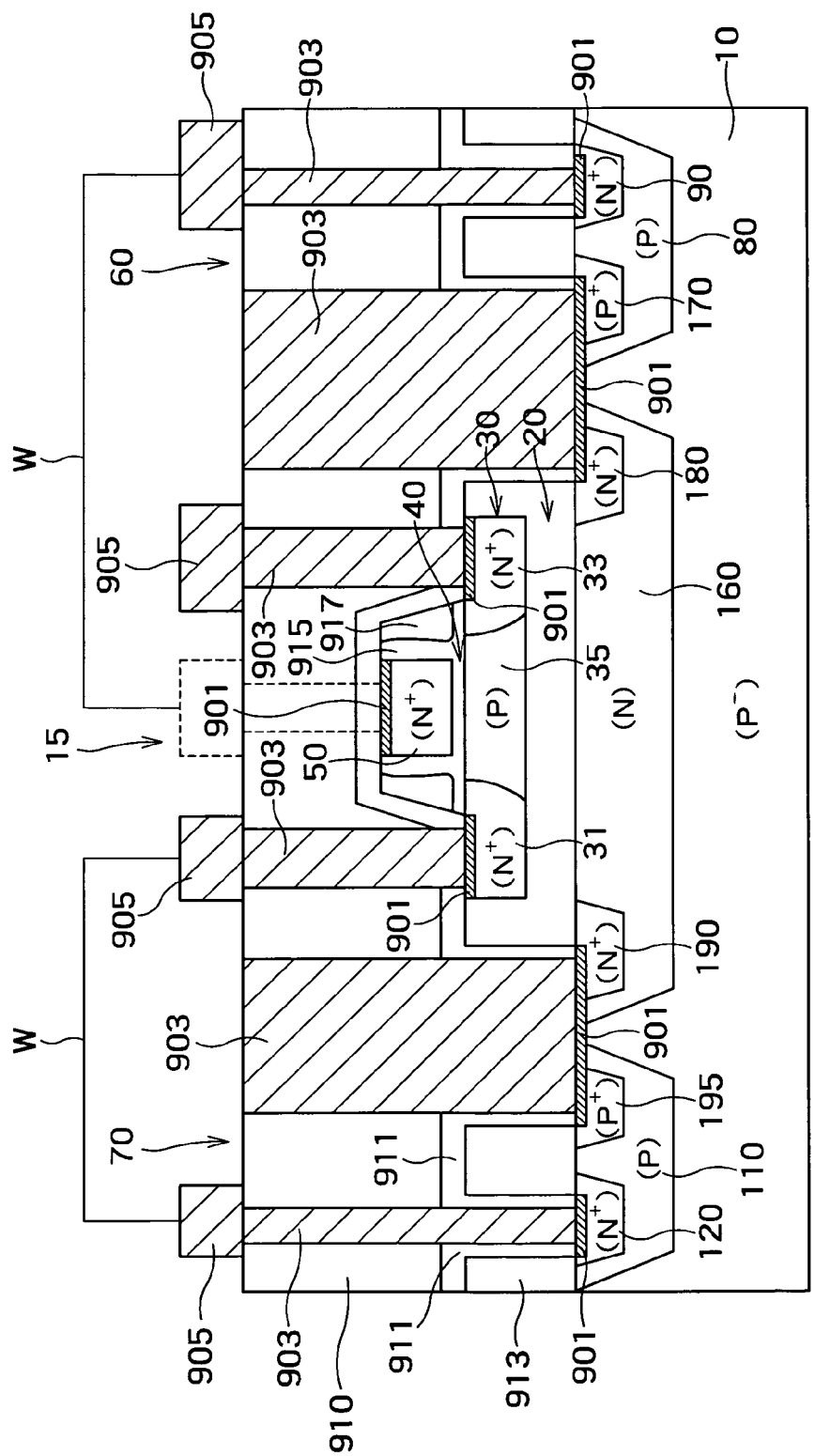
FIG. 5 is a sectional view of a semiconductor device 500 according to a first embodiment according to the invention.

FIG. 5 is a sectional view of a semiconductor device 500 according to a first embodiment according to the invention. The first embodiment is different from the first to fourth reference examples on the point that an N-type well is formed in the region of the semiconductor substrate 10 immediately below the channel forming region 35. For example, in a memory device such as an FBC (Floating Body Cell), in order to improve a data hold capacity, an N-type well 160 is formed in the semiconductor substrate region immediately below the P-type channel forming region 35.

In such case, in order to form the protective diode 60 within the well 160, it is necessary to form a P$^+$-type high concentration layer within the N-type well 160. In such protective layer 60, when a positive voltage is applied to the gate electrode 50, a voltage is applied forwardly to the protective layer 60. Accordingly, the semiconductor device 500 does not operate normally. Further, at the time of normal use, the well 160 is applied with a lower voltage than that to the source layer 31. Accordingly, in the case where the protective diode 70 is formed within the well 160, at the time of normal use, it is not preferred because a voltage is applied forwardly to the protective diode 70. Therefore, it is necessary to dispose the protective diodes 60 and 70 in the P-type well (i.e., in the first diffusion layer 110 and the third diffusion layer 80) separated from the N-type well 160 as shown in FIG. 5.

In the protective diode 70, the first diffusion layer 110 is separated from the well 160. The second diffusion layer 120 is not only provided within the first diffusion layer 110, but also a P$^+$-type contact layer 195 is provided within the first diffusion layer 110. An N$^+$-type contact layer 190 is formed within the well 160.

Silicide layers 901 are provided on the contact layers 190 and 195. Contact plugs 903 are provided on the silicide layers 901. The contact layers 190 and 195 are electrically short-circuited each other by the silicide layers 901 and the contact plugs 903. Thereby, though the first diffusion layer 110 separates from the well 160, the first diffusion layer 110 has the same potential as the well 160.

The second diffusion layer 120 and the source layer 31 are electrically connected by the first conductive layers 905 and wiring W via the silicide layers 901 and the contact plugs 903. The wiring W may be formed in the same layer as the first conductive layers 905.

The protective diode 70 has a lower reverse break-down voltage than the break-down voltage of the BOX layer 20, as well as in the first reference example. Accordingly, when an excessive positive voltage is applied to the SOI layer 30 by plasma, static electricity, etc. during manufacture or after manufacture of the semiconductor device 500, the protective diode 70 is broken down prior to the BOX layer 20. Thereby, the protective diode 70 can protect the BOX layer 20.

On the other hand, in the protective diode 60, the third diffusion layer 80 is formed so as to separate from the well 160. The fourth diffusion layer 90 is not only provided within the third diffusion layer 80, but also a $P^+$-type contact layer 170 is provided within the third diffusion layer 80. An $N^+$-type contact layer 180 is formed within the well 160.

Silicide layers 901 are provided on the contact layers 170 and 180. Contact plugs 903 are provided on the silicide layers 901. The contact layers 170 and 180 are electrically short-circuited by the suicide layers 901 and the contact plugs 903. Thereby, though the third diffusion layer 80 separates from the well 160, the third diffusion layer 80 has the same potential as the well 160.

The fourth diffusion layer 90 and the gate electrode 50 are electrically connected each other by the first conductive layers 905 and wiring W via the silicide layers 901 and the contact plugs 903. The wiring W may be provided in the same layer as the first conductive layers 905.

The protective diode 60 has a lower reverse break-down voltage than the break-down voltage of the gate insulating film 40, as well as in the first reference example. Accordingly, when an excessive voltage is applied to the gate electrode 50 during operation of the semiconductor device 500, the protective diode 60 is broken down prior to the gate insulating film 40. Thereby, the protective diode 60 can protect the gate insulating film 40.

When an excessive voltage is applied to the gate electrode 50 by plasma, static electricity, etc. during manufacture or after manufacture of the semiconductor device 500, the protective diode 60 can also protect the gate insulating film 40.

Second Embodiment

Figure 6:
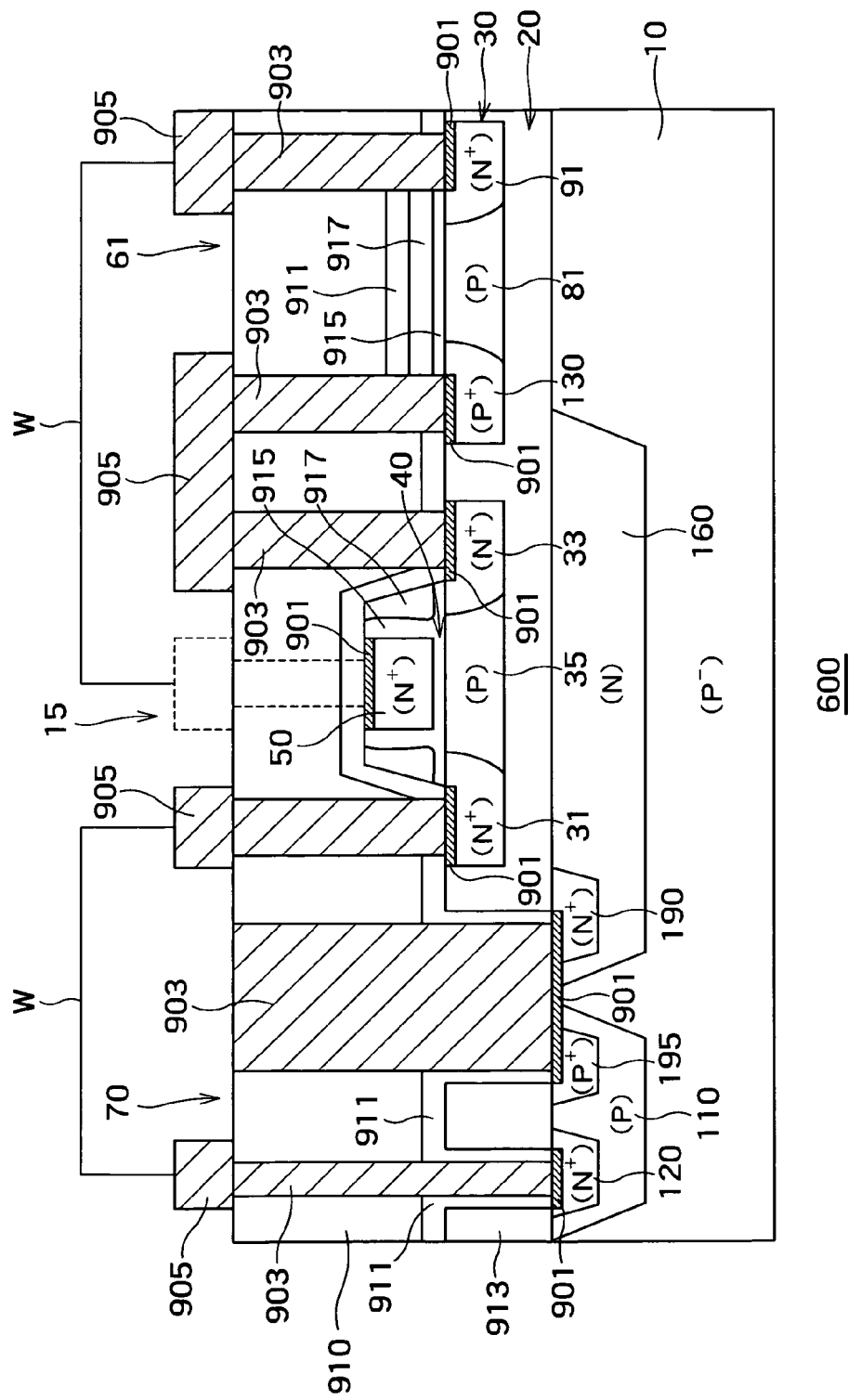
FIG. 6 is a sectional view of a semiconductor device 600 according to a second embodiment according to the invention.

FIG. 6 is a sectional view of a semiconductor device 600 according to a second embodiment according to the invention. The second embodiment is different from the first embodiment on the point that the protective diode 61 formed in the SOI layer 30 is adopted as a gate insulating film protective diode.

In the protective diode 61, since the third diffusion layer 81 is at the same potential as the drain layer 33, the third diffusion layer 81 is unnecessary to connect it to the well 160. The second embodiment further has the same advantage as the first embodiment.

Third Embodiment

Figure 7:
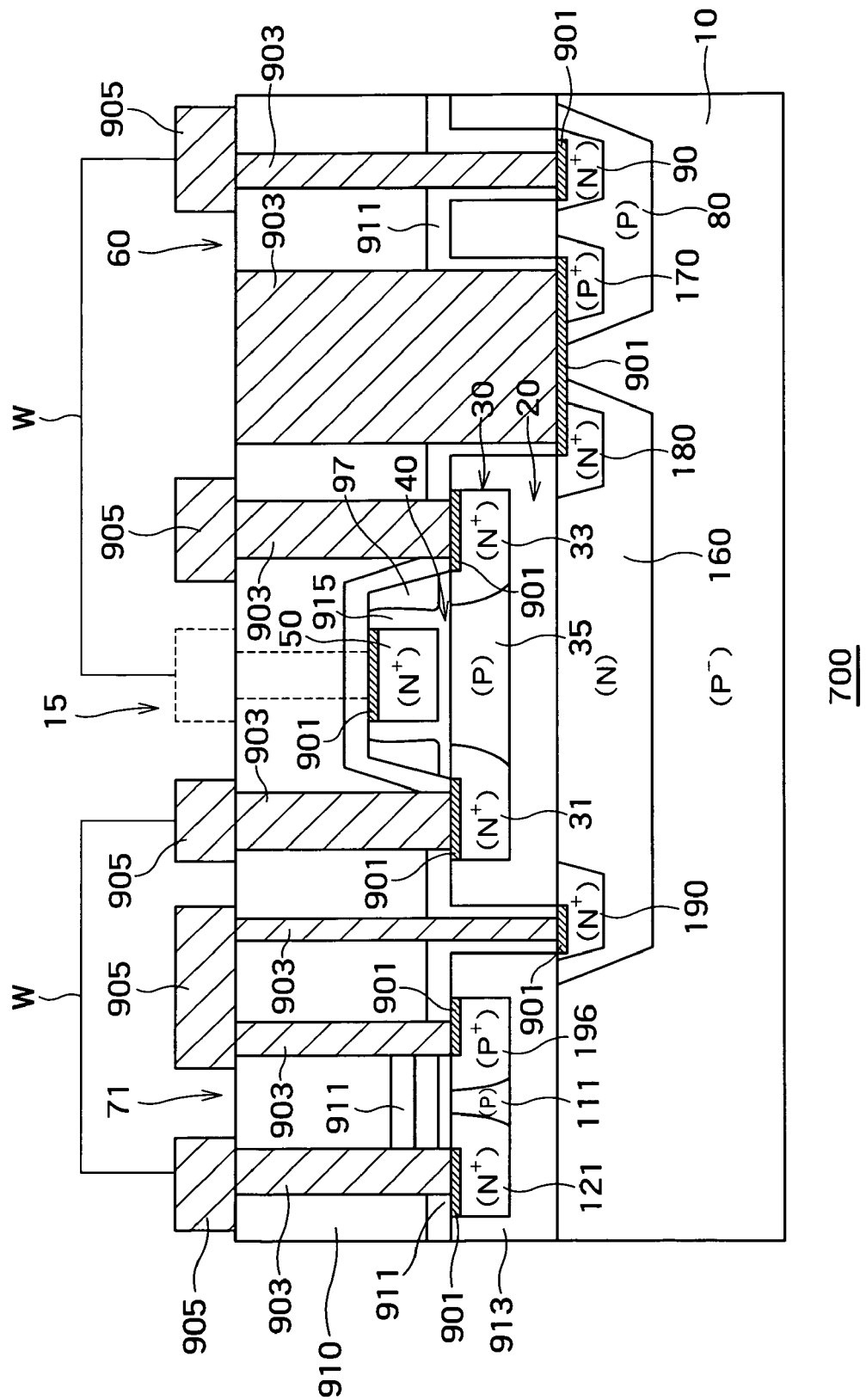
FIG. 7 is a sectional view of a semiconductor device 700 according to a third embodiment according to the invention.

FIG. 7 is a sectional view of a semiconductor device 700 according to a third embodiment according to the invention. The third embodiment is different from the first embodiment on the point that the protective diode 71 formed in the SOI layer 30 is adopted as an embedded insulating layer protective diode.

In the protective diode 71, in order to make the first diffusion layer 111 in the same potential as the well 160, the contact layer 196 provided so as to be adjacent to the first diffusion layer 111 is connected to the contact layer 190. Thereby, the third embodiment has the same advantage as the first embodiment.

Fourth Embodiment

Figure 8:
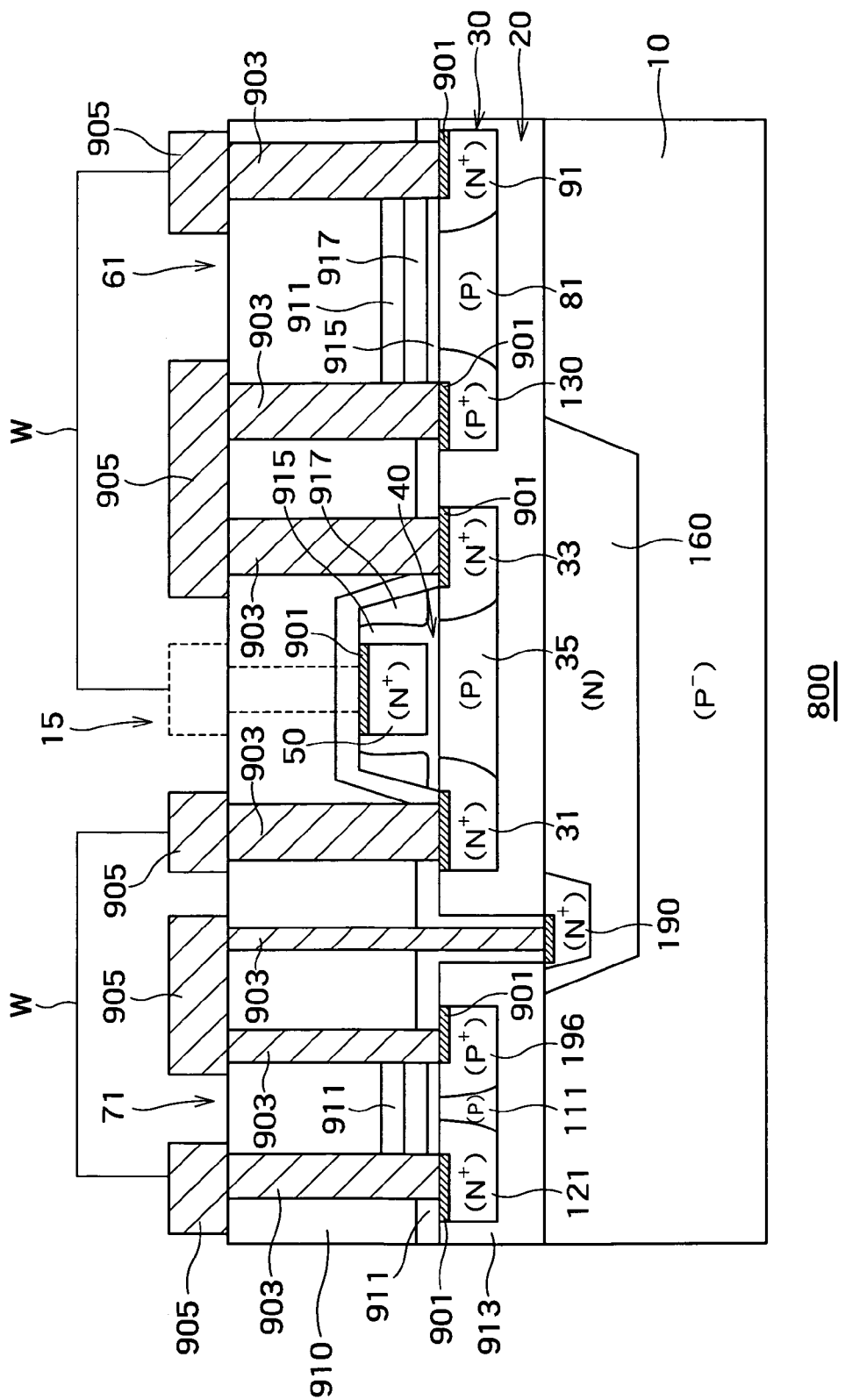
FIG. 8 is a sectional view of a semiconductor device 800 according to an fourth embodiment according to the invention.

FIG. 8 is a sectional view of a semiconductor device 800 according to an fourth embodiment according to the invention. The fourth embodiment is different from the first embodiment on the point that the protective diode 61 is adopted as a gate insulating film protective diode, and the protective diode 71 is adopted as an embedded insulating layer protective diode.

In the fourth embodiment, similarly, the protective diode 61 can protect the gate insulating film 40 and the protective diode 71 can protect the BOX layer 20.

In the first to fourth embodiments, the second diffusion layers 120 and 121 are electrically connected to the source layer 31, respectively. However, the second diffusion layers 120 and 121 may be electrically connected to the drain layer 33 or the channel forming region 35, respectively. Even in the case, the protective diodes 70 and 71 can protect the BOX layer 20.

In the second and fourth embodiments, the third diffusion layer 81 is connected to the drain layer 33 via the contact layer 130. However, the third diffusion layer 81 may be electrically connected to the source layer 31 or a body layer 35. Even in the case, the protective diode 61 can protect the gate insulating film 40. Further, the third diffusion layer 81 and the second diffusion layer 120 or 121 may be commonly connected to one of the source layer 31, the drain layer 33 and body layer 35.

In the first to fourth embodiments, the MOS transistor 15 can be applied to a memory cell such as an FBC. Alternatively, it can be applied to an MOSFET of a peripheral circuit formed on the periphery of the memory region or a logic circuit. Further, in the first to fourth embodiments, the semiconductor substrate 10 is a P-type semiconductor substrate. However, the semiconductor substrate 10 may be an N-type semiconductor substrate. In this case, according to the concentration of impurities in the semiconductor substrate 10, the N-type well 160 becomes unnecessary.

In the case where a multilayer wiring structure is included in the above described embodiments, the interconnection wiring between the source layer 31, the drain layer 33 or the channel forming region 35 and the second diffusion layers 120, 121 is preferably first interconnection wirings formed in the first layer of the multilayer interconnection structure. Similarly, all of the interconnection wiring between the contact layers 140 and 150, the interconnection wiring between the gate electrode 50 and the fourth diffusion layers 90 and 91, and the interconnection wiring between the source layer 31, the drain layer 33 or the channel forming region 35 and the contact layer 130 are preferably interconnection wirings formed in the first layer of the multilayer interconnection structure. Thereby, the protective diodes 60,

61, 70, and 71 can eliminate the charge stored when the interconnection wirings in the second layer or the subsequent layers and protect the gate insulating film 40 and the BOX layer 20.

Figure 9:
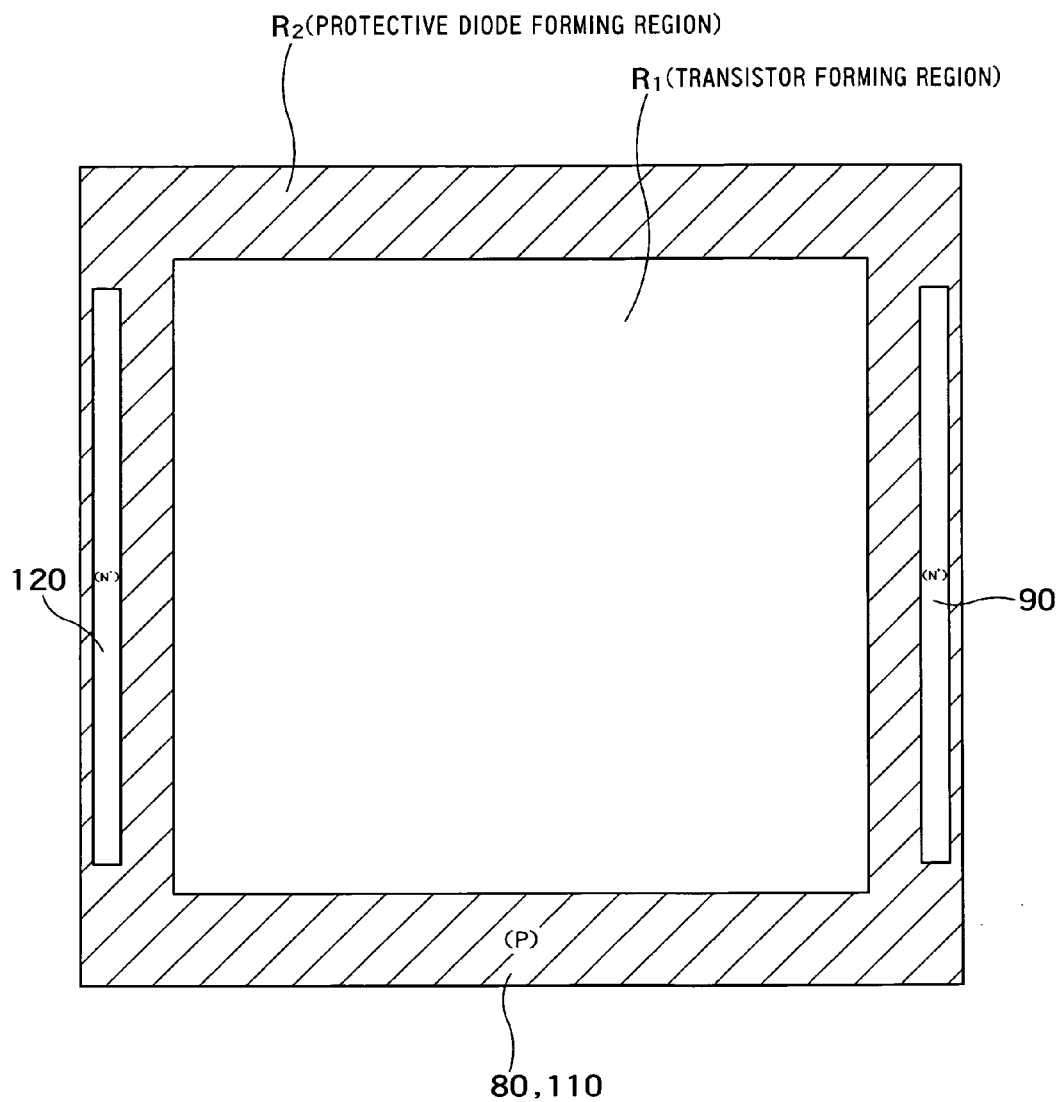
FIG. 9 is a plan view of the semiconductor device 100 according to the first reference example.

FIG. 9 is a plan view of the semiconductor device 100 according to the first reference example. The region R1 is a region for forming the transistor 15, and the region R2 is a region for forming the protective diodes 60 and 70. In the first reference example, the transistor forming region R1 is of P$^-$-type, and the protective diode forming region R2 is of P-type.

The protective diode forming region R2 is formed in a ring shape so as to surround the transistor forming region R1. Furthermore, the N$^+$-type second and fourth diffusion layers 90 and 120 are provided within the protective diode forming region R2.

Figure 10:
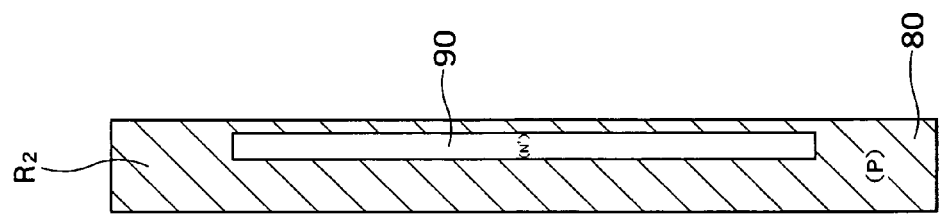
FIG. 10 is another plan view of the semiconductor device 100 according to the first reference example.
Figure 10:
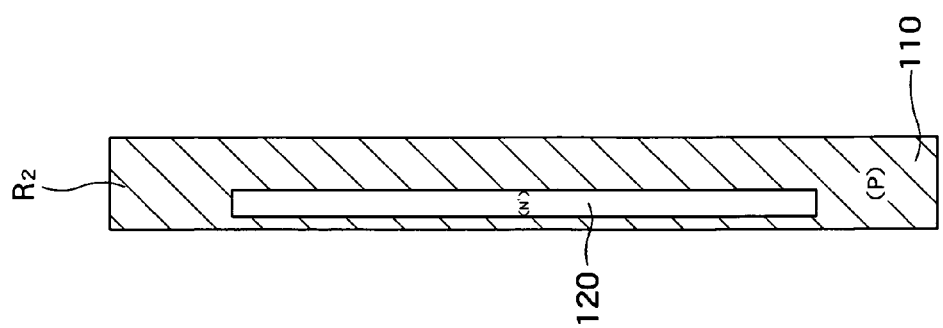

FIG. 10 is another plan view of the semiconductor device 100 according to the first reference example. As shown in FIG. 10, the protective diode forming region R2 may be formed so as to be separated on both sides of the transistor forming region R1.

Figure 11:
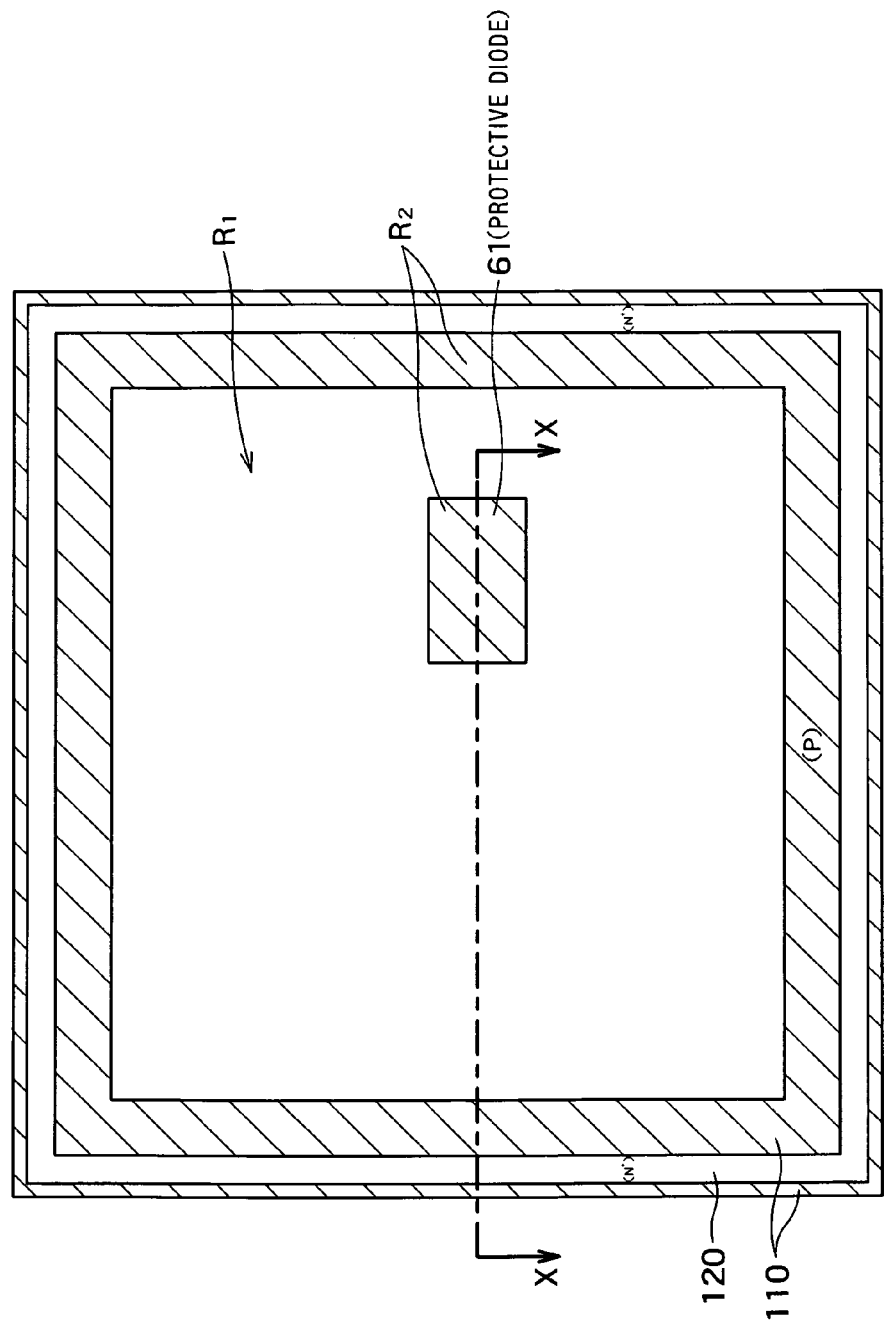
FIG. 11 is a plan view of the semiconductor device 200 according to the second reference example.

FIG. 11 is a plan view of the semiconductor device 200 according to the second reference example. FIG. 2 shows the section along the X—X line. The protective diode 61 is provided in the transistor forming region R1. The P-type first diffusion layer 110 is formed in a ring shape so as to surround the transistor forming region R1 and the protective diode 61.

Figure 12:
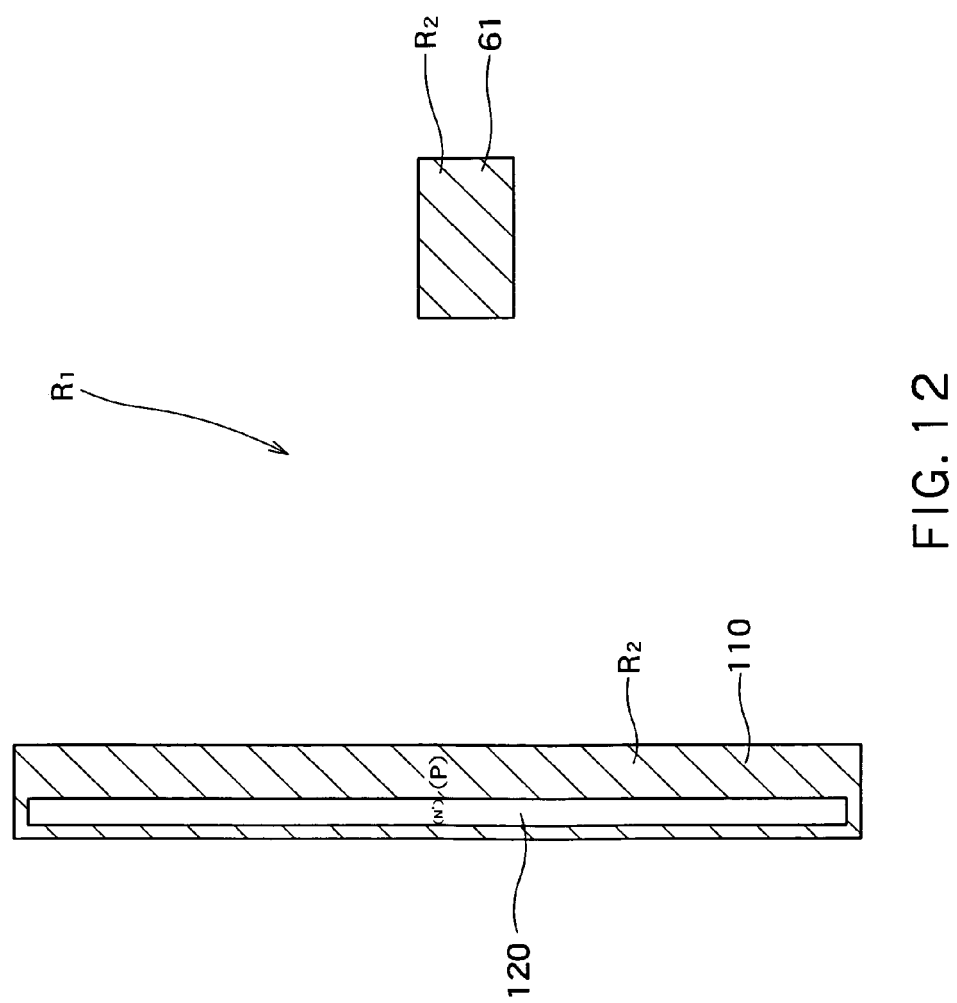
FIG. 12 is another plan view of the semiconductor device 200 according to the second reference example.

FIG. 12 is another plan view of the semiconductor device 200 according to the second reference example. The protective diode 61 and the first diffusion layer 110 are provided on both sides of the transistor forming region R1. The first diffusion layer 110 may be provided in such an island shape.

The third and fourth reference examples may have one of the protective diode forming regions R2 shown in FIGS. 9 to 12, or the P$^+$-type contact layer 150 in the region R2.

Figure 13:
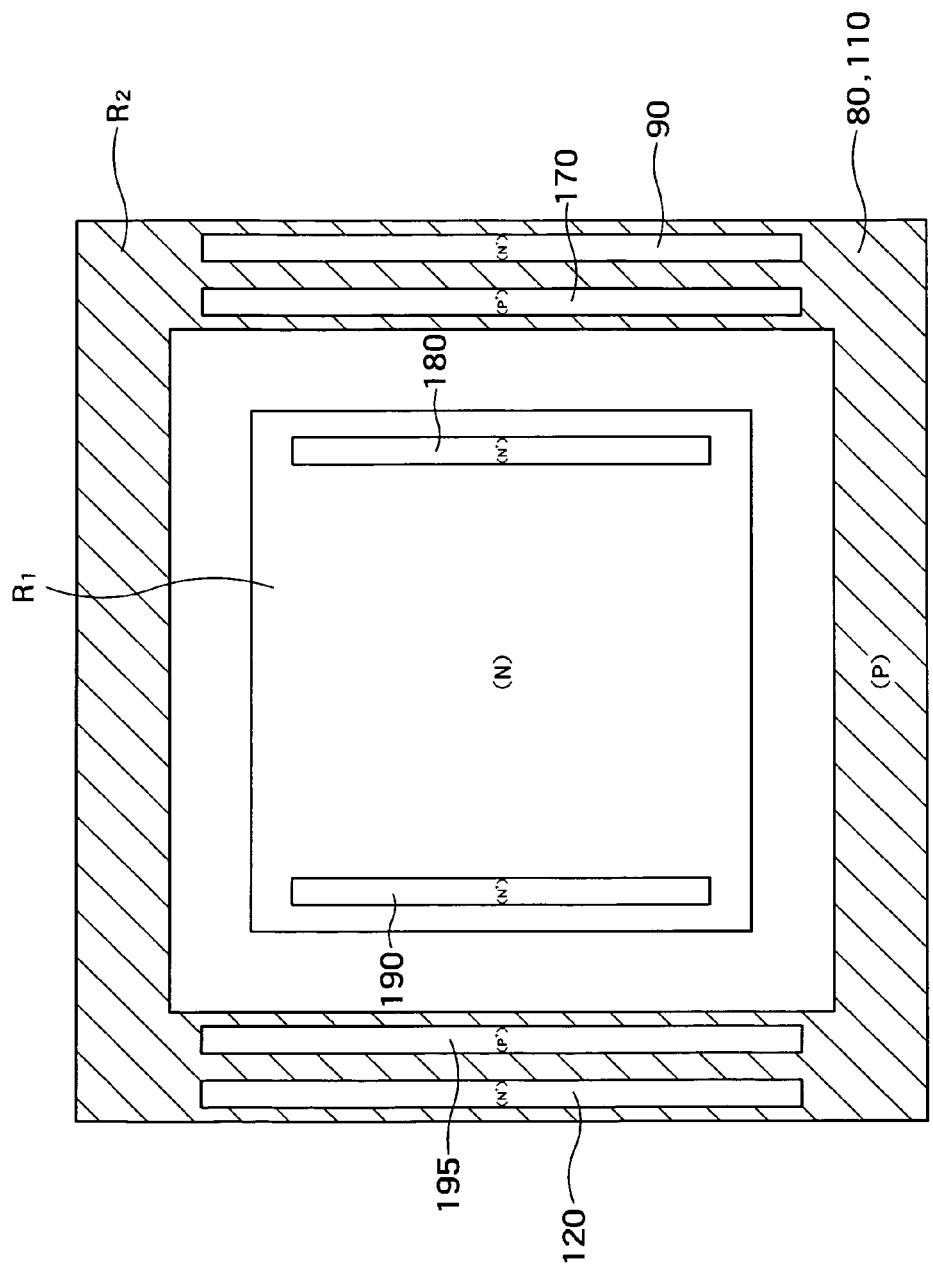
FIG. 13 is a plan view of the semiconductor device 500 according to the first embodiment.

FIG. 13 is a plan view of the semiconductor device 500 according to the first embodiment. The protective diode forming region R2 is formed so as to surround the transistor forming region R1. The N$^+$-type contact layers 180 and 190 are provided within the transistor forming region R1. The P$^+$-type contact layers 170 and 196 and the N$^+$-type second and fourth diffusion layers 90 and 120 are provided within the protective diode forming region R2.

Figure 14:
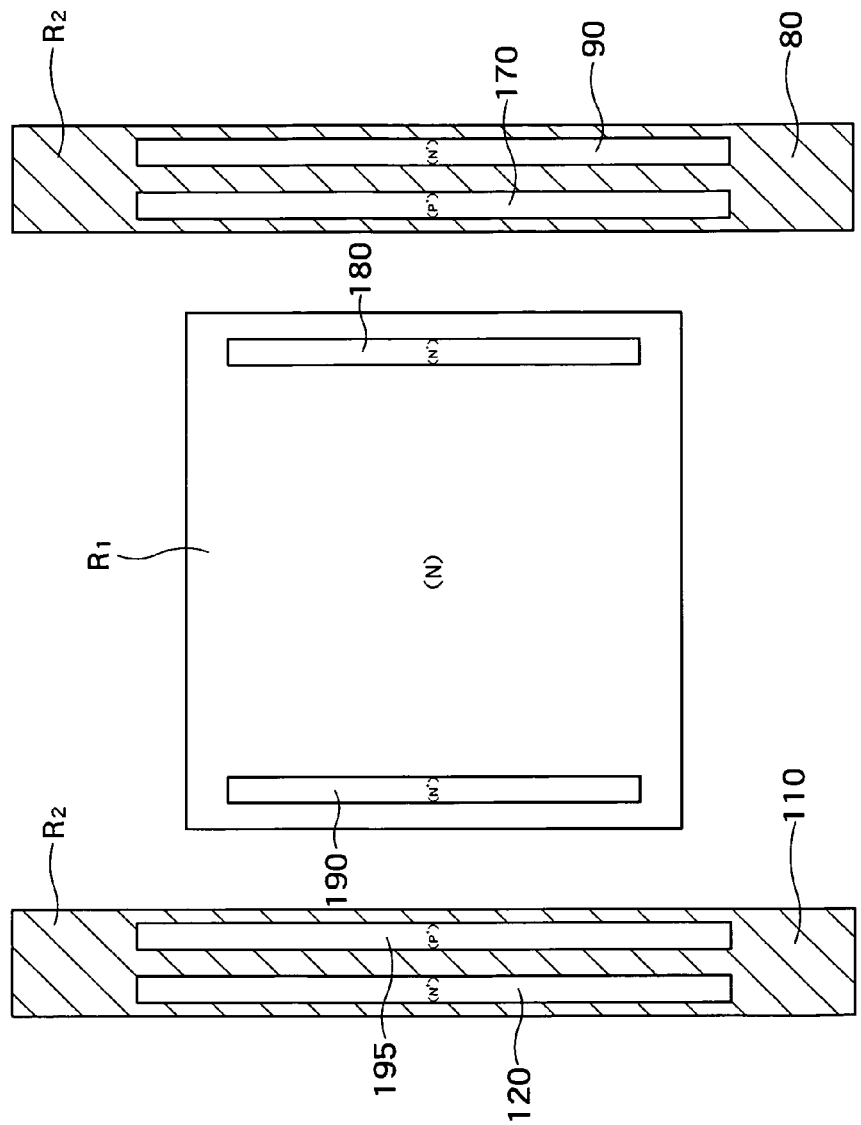
FIG. 14 is another plan view of the semiconductor device 500 according to the first embodiment.

FIG. 14 is another plan view of the semiconductor device 500 according to the first embodiment. As shown in FIG. 14, the protective diode forming region R2 may be formed so as to be separated on both sides of the transistor forming region R1.

The second to fourth embodiments may have the protective diode forming region R2 shown in FIG. 13 or 14 in a similar manner as that in FIG. 11 or FIG. 12.

The invention claimed is:

1. A semiconductor device comprising:
   a semiconductor substrate;
   an embedded insulating layer provided on the semiconductor substrate;
   a semiconductor layer provided on the embedded insulating layer;
   a transistor including a first conductivity type source layer formed within the semiconductor layer, a first conductivity type drain layer formed in the semiconductor layer, and a channel forming region between the source layer and the drain layer; and
   an embedded insulating layer protective diode including a second conductivity type first diffusion layer and a first conductivity type second diffusion layer, the first diffusion layer being at the same potential as a semiconductor substrate region immediately below the channel forming region, the second diffusion layer being provided adjacently to the first diffusion layer and electrically connected to at least one of the source layer, the drain layer and the channel forming region;
   Wherein the semiconductor substrate is a second conductivity type, and the semiconductor substrate region immediately below the channel forming region is a first conductivity type.

2. The semiconductor device according to claim 1, wherein
   the semiconductor substrate region immediately below the channel forming region is connected to the first diffusion layer by a metal plug.

3. The semiconductor device according to claim 1, wherein
   the transistor functions as a peripheral circuit element, input/output circuit element of a memory cell or the memory cell itself, the memory cell storing a data by accumulating charges in the channel forming region.

4. The semiconductor device according to claim 1, wherein
   an interconnection, which is formed in a first layer of a multilayer wiring structure, connects between the source layer, the drain layer or the channel forming region and the second diffusion layer.

5. The semiconductor device according to claim 1, wherein
   the first diffusion layer is provided within the semiconductor substrate,
   wherein the second diffusion layer is provided within the first diffusion layer so as to be adjacent to the first diffusion layer.

6. The semiconductor device according to claim 5, wherein
   the transistor further includes a gate electrode provided on a gate insulating film on the channel forming region, the semiconductor device further comprising:
   a gate insulating film protective diode including a second conductivity type third diffusion layer and a first conductivity type fourth diffusion layer, the third diffusion layer being at the same potential as a semiconductor substrate region immediately below the channel forming region and being provided within the semiconductor substrate, the fourth diffusion layer being provided within the third diffusion layer and electrically connected to the gate electrode.

7. The semiconductor device according to claim 5, wherein
   the transistor further includes a gate electrode provided on a gate insulating film on the channel forming region, the semiconductor device further comprising:
   a gate insulating film protective diode including a second conductivity type third diffusion layer and a first conductivity type fourth diffusion layer, the third diffusion layer being at the same potential as at least one of the source layer, the drain layer and the channel forming region and being provided within the semiconductor layer, the fourth diffusion layer being provided within the third diffusion layer and electrically connected to the gate electrode.

8. The semiconductor device according to claim 1, wherein
   the first diffusion layer is provided within the semiconductor layer, wherein the second diffusion layer is provided within the semiconductor layer so as to be adjacent to the first diffusion layer.

9. The semiconductor device according to claim 8, wherein the transistor further includes a gate electrode provided on a gate insulating film on the channel forming region, the semiconductor device further comprising:

a gate insulating film protective diode including a second conductivity type third diffusion layer and a first conductivity type fourth diffusion layer, the third diffusion layer being at the same potential as a semiconductor substrate region immediately below the channel forming region and being provided within the semiconductor substrate, the fourth diffusion layer being provided within the third diffusion layer and electrically connected to the gate electrode.

10. The semiconductor device according to claim 8, wherein the transistor further includes a gate electrode provided on a gate insulating film on the channel forming region, the semiconductor device further comprising:

a gate insulating film protective diode including a second conductivity type third diffusion layer and a first conductivity type fourth diffusion layer, the third diffusion layer being at the same potential as at least one of the source layer, the drain layer and the channel forming region and being provided within the semiconductor layer, the fourth diffusion layer being provided within the third diffusion layer and electrically connected to the gate electrode.

11. The semiconductor device according to claim 1, wherein the transistor further includes a gate electrode provided on a gate insulating film on the channel forming region, the semiconductor device further comprising:

a gate insulating film protective diode including a second conductivity type third diffusion layer and a first conductivity type fourth diffusion layer, the third diffusion layer being at the same potential as the semiconductor substrate region immediately below the channel forming region and being provided within the semiconductor substrate, the fourth diffusion layer being provided within the third diffusion layer and electrically connected to the gate electrode.

12. The semiconductor device according to claim 11, wherein the semiconductor substrate region immediately below the channel forming region is connected to the third diffusion layer by a metal plug.

13. The semiconductor device according to claim 11, wherein an interconnection, which is formed in a first layer of a multilayer wiring structure, connects between the source layer, the drain layer or the channel forming region and the second diffusion layer.

14. The semiconductor device according to claim 11, wherein an interconnection, which is formed in a first layer of a multilayer wiring structure, connects between the gate electrode and the fourth diffusion layer.

15. The semiconductor device according to claim 1, wherein the transistor further includes a gate electrode provided on a gate insulating film on the channel forming region, the semiconductor device further comprising:

a gate insulating film protective diode including a second conductivity type third diffusion layer and a first conductivity type fourth diffusion layer, the third diffusion layer being at the same potential as at least one of the source layer, the drain layer and the channel forming region and being provided within the semiconductor layer, the fourth diffusion layer being provided within the third diffusion layer and electrically connected to the gate electrode.

16. The semiconductor device according to claim 15, wherein an interconnection, which is formed in a first layer of a multilayer wiring structure, connects between the gate electrode and the fourth diffusion layer.

* * * * *